United States Patent
Reisinger et al.

(10) Patent No.: US 12,255,553 B2
(45) Date of Patent: Mar. 18, 2025

(54) MEASURING ASSEMBLY FOR AN INVERTER AND INVERTER ASSEMBLY

(71) Applicant: AVL List GmbH, Graz (AT)

(72) Inventors: Erwin Reisinger, Feldkirchen bei Graz (AT); Martin Schmidt, Langen (DE)

(73) Assignee: AVL List GmbH, Graz (AT)

( * ) Notice: Subject to any disclaimer, the term of this patent is extended or adjusted under 35 U.S.C. 154(b) by 223 days.

(21) Appl. No.: 18/010,471

(22) PCT Filed: Jun. 16, 2021

(86) PCT No.: PCT/AT2021/060204
§ 371 (c)(1),
(2) Date: Dec. 15, 2022

(87) PCT Pub. No.: WO2021/253064
PCT Pub. Date: Dec. 23, 2021

(65) Prior Publication Data
US 2023/0163699 A1 May 25, 2023

(30) Foreign Application Priority Data
Jun. 16, 2020 (AT) .............. A 50516/2020

(51) Int. Cl.
*H02M 7/539* (2006.01)
*H02M 1/00* (2006.01)
(Continued)

(52) U.S. Cl.
CPC ....... *H02M 7/5395* (2013.01); *H02M 1/0009* (2021.05); *H02M 7/217* (2013.01); *H02P 27/06* (2013.01)

(58) Field of Classification Search
CPC .. H02M 7/5395; H02M 1/0009; H02M 7/217; H02P 27/06
See application file for complete search history.

(56) References Cited

U.S. PATENT DOCUMENTS

| | | | |
|---|---|---|---|
| 11,356,037 B2 * | 6/2022 | Miyazaki | .......... H02M 7/53803 |
| 2006/0006741 A1 | 1/2006 | Tassitino et al. | |
| 2019/0047614 A1 | 2/2019 | Kashima et al. | |

FOREIGN PATENT DOCUMENTS

| | | |
|---|---|---|
| DE | 112018001405 | 10/2018 |
| EP | 2555368 | 2/2013 |

(Continued)

OTHER PUBLICATIONS

International Search Report and the Written Opinion Dated Sep. 17, 2021 From the International Searching Authority Re. Application No. PCT/AT2021/060204 and its Translation into English. (13 Pages).

*Primary Examiner* — Kyle J Moody (57) ABSTRACT

Measuring arrangement for determining the bridge currents of a switched electrical converter unit (2), in which, in a modulation process, at least two electronic half bridges (3, 3') are switched with temporally offset actuation signals by a control unit (4), comprising a measuring unit (1) that is connected to current sensors (6, 6'), wherein the current sensors (6, 6') are arranged in the output or input lines of the half bridges (3, 3') in order to measure the bridge currents, and the measuring unit (1) is connected to the control unit (4) for temporal synchronisation, wherein the measuring unit (1) is designed to define measurement times (8, 8') of the current sensors (6, 6') which are temporally synchronised with the actuation signals of the half bridges (3, 3'), as well as an inverter arrangement having such a measuring arrangement.

18 Claims, 4 Drawing Sheets

(51) Int. Cl.
*H02M 7/217* (2006.01)
*H02M 7/5395* (2006.01)
*H02P 27/06* (2006.01)

(56) References Cited

FOREIGN PATENT DOCUMENTS

| | | |
|---|---|---|
| EP | 2804310 | 11/2014 |
| EP | 3477314 | 5/2019 |
| EP | 3651339 | 5/2020 |

\* cited by examiner

MEASURING ASSEMBLY FOR AN INVERTER AND INVERTER ASSEMBLY

RELATED APPLICATIONS

This application is a National Phase of PCT Patent Application No. PCT/AT2021/060204 having International filing date of Jun. 16, 2021, which claims the benefit of priority of Austrian Patent Application No. A50516/2020 filed on Jun. 16, 2020. The contents of the above applications are all incorporated by reference as if fully set forth herein in their entirety.

FIELD AND BACKGROUND OF THE INVENTION

The invention relates to a measuring arrangement for a converter and an inverter arrangement having such a measuring arrangement.

Measuring arrangements for determining the power transmitted by an electrical converter are known from the prior art. Usually, current and voltage are thereby measured on the AC side or on the DC side of the converter, and the transmitted power determined on this basis. This can be achieved with high accuracy with interference-free harmonic signals However, in inverter arrangements with high-frequency switched converter units, these measuring arrangements lead to inaccurate results. Such high-frequency switched converter units have several electronically controlled half bridges which, in a modulation process such as pulse width modulation (PWM), are switched on and off, with temporally offset actuation signals, by an electronic control unit. For example, in a PWM inverter, the semiconductor switches of the half bridges switch the input voltage on and off with high and time-variable switching frequency; the generated AC voltage is thus composed of small pulses of differing width which are passed to a choke, so that an approximately sinusoidal output current is achieved. The switching frequency of the half bridges is thereby significantly higher than the frequency of the useful signal.

This high switching frequency affects the generated output signal, so that this is subject to harmonics. The harmonics cause losses, so that the switched electrical power and other electrical parameters can only be determined with difficulty with such converters. For example, it is difficult to determine the operating point and efficiency of an electrical machine when measuring the electrical parameters on the input side of the machine, since such a measurement has to be made within a particular frequency range and does not take into account the power of the harmonics. As a result, the characteristic values and machine parameters required for the control of the electrical machine are subject to great uncertainties. For practical purposes, nonlinear effects associated with current and switching frequency cannot be determined.

For these and other reasons, there is a need for a measuring arrangement allowing the exact determination of the switched electrical power and other parameters in switched converters. According to the invention, these and other problems are solved with a measuring arrangement according to claim 1.

SUMMARY OF THE INVENTION

A measuring arrangement according to the invention is designed to determine the electrical power of a switched electrical converter unit in which, in a modulation process, at least two electronic half bridges are switched with temporally offset actuation signals by a control unit. The half bridges can in each case have two semiconductor switches, in particular SiC or GaN semiconductor switches. Such semiconductor switches can consist of several components and can in particular comprise freewheeling diodes arranged in parallel.

The converter unit can be a switched inverter arrangement for converting a DC voltage $V_{dc}$ into an AC voltage $V_{ac}$. The converter unit can also be a switched rectifier arrangement for converting an AC voltage $V_{ac}$ into a DC voltage $V_{dc}$. The converter unit can also be a switched DC converter for converting a first DC voltage $V_1$ into a second DC voltage $V_2$.

The measuring arrangement according to the invention comprises a measuring unit connected to current sensors which are designed to measure the bridge currents in the output or input lines of the half bridges of the converter unit. Interfaces of the converter unit can be used for this purpose. The current sensors can be highly dynamic sensors whose measuring frequency is at least equal to or higher than the switching frequency of the PWM process. The current sensors can be arranged in the output or input lines of the half bridges of the converter unit.

The control unit and the measuring unit can be designed as electronic data processing units. The control unit and the measuring unit can be designed as separate and independent units, so that an existing inverter arrangement with a control unit can be supplemented by a compatible measuring unit for power measurement. Alternatively, the control unit and the measuring unit can be integrated in a common unit.

The measuring unit is connected to the control unit for temporal synchronisation. This allows the timing of the PWM actuation signals defined by the control unit to be transmitted to the measuring unit.

The measuring unit is designed to define measurement times of the current sensors which are synchronised in time with the actuation signals of the half bridges. This ensures that measured values of the current sensors are taken into account at those times at which the corresponding half bridge is activated, i.e. current-bearing. Thus, the electrical current supplied or drawn by the half bridge can be measured in each pulse of the PWM process. Consequently, the currents of each half bridge of the converter unit can be taken into account when calculating the electrical power, which results in a more accurate power measurement than if only the resulting total current were taken into account. In particular, this makes it possible for dead times between the bridge switches also to be taken into account.

The measuring unit can be designed to query the current sensors with a measuring frequency that corresponds approximately to the frequency of the actuation signals. In this case, the control unit or the measuring unit defines measurement times which lie substantially in the middle of the duty cycle of the actuation signals. Alternatively, the measuring unit can be designed to query the current sensors with a measuring frequency that is higher than the frequency of the actuation signals. In this case, the measuring unit obtains several measured values during a PWM pulse and the measuring unit subsequently selects those measurement times which lie substantially in the middle of the duty cycle $t_{on}$ of the actuation signals. In this case, the measuring unit can also be designed to query the current sensors at several measurement times during the duty cycle of the actuation signals, and to average the resulting measured values during a PWM pulse. This allows the average current value of this PWM pulse to be measured particularly accurately.

According to the invention, the measuring unit can be connected to at least one DC voltage sensor arranged on the DC voltage side of the converter unit. The measuring unit can be designed to determine the switched electrical power from the measured bridge currents and the measured DC voltage on the DC voltage side. In principle, the direction of the power flow is not relevant; the converter unit can be designed as a rectifier or inverter. The total electrical power transmitted during a period of the useful signal can be calculated as the sum of the individual measured current values in the PWM pulses multiplied by the measured DC voltage, based on the respective duration of the PWM pulses relative to the period duration of the useful signal. In the case of a multiphase converter unit, this calculation can also be carried out for individual phases of the converter unit in order to determine the electrical power supplied or drawn per phase.

Furthermore, the measuring unit can be designed to take into consideration the electrical internal resistances of the semiconductor switches and other electronic components of the half bridges, for example parallel-connected freewheeling diodes, when calculating the electrical power of the converter unit.

Furthermore, according to the invention, the measuring unit can also be connected to a DC sensor arranged on the DC voltage side of the converter unit. Consequently, the measuring unit can calculate the electrical power drawn or supplied on the DC side. By comparing it with the electrical power calculated on the AC side from the individual bridge currents, the electrical efficiency of the converter unit can be calculated.

The invention further relates to an inverter arrangement having a measuring arrangement according to the invention, wherein the converter unit can be a switched rectifier arrangement, a switched inverter arrangement or a switched DC converter. In this case, the measuring unit is preferably integrated with the control unit in a common data processing unit.

The converter unit can be connected to an electrical machine such as an electric motor or an electric generator. The measuring unit can also be connected to the electrical machine.

In particular, the measuring unit can be designed to receive mechanical measured values such as speed, torque, acceleration and the like and to calculate the mechanical power of the electrical machine from these mechanical measured values. For this purpose, the measuring unit can be designed for connection to external sensors of the machine.

The measuring unit can be designed to receive thermal measured values such as the temperature of a motor winding, waste heat or differential temperature of a cooling medium of the electrical machine or the like. The measuring unit can also be designed to determine from these thermal measured values the mechanical power of the electrical machine.

The measuring unit can be designed to determine from the electrical or mechanical measured values parameters of the components of an electrical and/or mechanical equivalent circuit diagram of the electrical machine.

The measuring unit can also be designed to determine from the calculated electrical power of the converter unit and the calculated mechanical power of the electrical machine the efficiency of the electrical machine, i.e. the efficiency of the conversion of the electrical power into mechanical power or vice versa.

The measuring unit can also be designed to determine parameters derived from the electrical and mechanical measured values, such as the active power, reactive power or power factor of the electrical machine.

In particular, the inverter arrangement can be used in an industrial application, a test bench for vehicles, or in a vehicle. Particularly preferably, the converter unit of the inverter arrangement can also draw a DC voltage from a DC voltage intermediate circuit of a test bench or supply such. When used in a test bench, the DC voltage sensor can preferably be arranged in a central DC voltage intermediate circuit in order to be able to calculate in a simple manner the electrical power drawn or supplied by the converter unit.

BRIEF DESCRIPTION OF THE SEVERAL VIEWS OF THE DRAWINGS

Further features according to the invention are disclosed in the claims, the figures and the following description of the figures. The invention is explained below on the basis of non-exclusive exemplary embodiments:

DESCRIPTION OF SPECIFIC EMBODIMENTS OF THE INVENTION

Figure 1A:
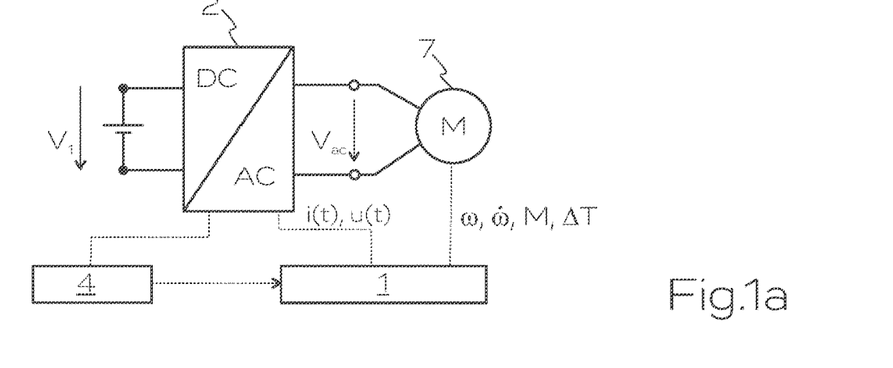
FIG. 1a shows an example of an embodiment of a measuring arrangement according to the invention as a schematic block diagram with an electrical machine.

FIG. 1a shows an example of an embodiment of a measuring arrangement according to the invention as a schematic block diagram. The measuring arrangement comprises an electronic measuring unit 1 which is connected via interfaces to current sensors 6, 6' (not shown) in an electrical converter unit 2. The measuring unit 1 is also connected via interfaces to sensors for measuring mechanical parameters of an electrical machine 7, namely the speed, acceleration, torque and waste heat of the electrical machine.

In this exemplary embodiment, the converter unit 2 is a switched inverter arrangement which converts a DC voltage $V_1$ supplied by a battery into an AC voltage $V_{ac}$ for operation of the electrical machine 7. The converter unit 2 comprises two electronic half bridges 3, 3' which, in a modulation process, are switched with temporally offset actuation signals by an electronic control unit 4. In this exemplary embodiment, the control unit 4 and the measuring unit 1 are designed as separate units. The control unit 4 calculates trigger times for actuating the electronic half bridges 3, 3' of the converter unit 2 and makes these available to the converter unit 2. The current sensors 6, 6' are arranged in the output or input lines of the half bridges 3, 3' of the converter unit 2 in order to measure the bridge currents.

The measuring unit 1 is connected to the control unit 4 for temporal synchronisation and is designed to define measurement times 8, 8' of the current sensors 6, 6' which are synchronised in time with the actuation signals of the half bridges 3, 3'. This allows the measuring unit 1 to detect the current values exactly when the PWM actuation signals activate the respective half bridge.

Figure 1B:
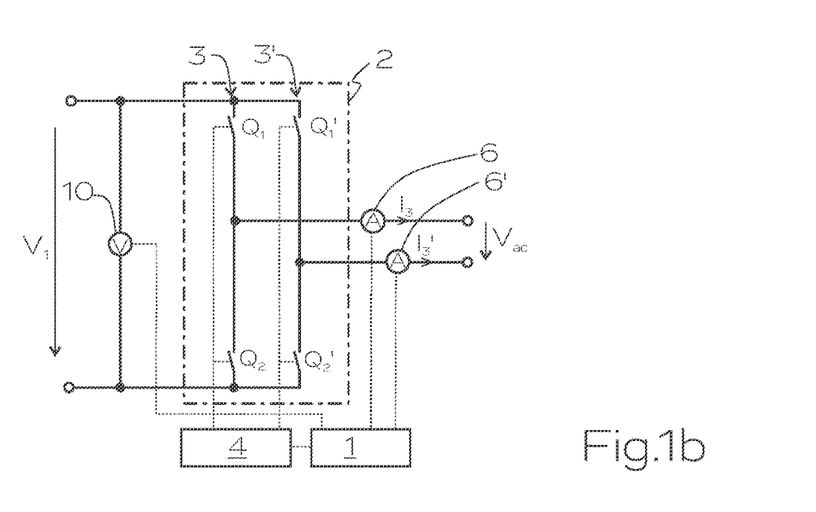
FIG. 1b shows an example of an embodiment of a measuring arrangement according to the invention as a schematic circuit diagram.

FIG. 1b shows an example of an embodiment of a measuring arrangement according to the invention as a schematic circuit diagram. In this circuit diagram, the inner structure of the converter unit 2, which functions here as an inverter, is represented schematically. The half bridges 3, 3' in each case comprise two electronic semiconductor switches, namely—depending on the desired voltage range and desired dynamics—SiC or GaN transistors $Q_1$, $Q_2$, $Q_1'$, $Q_2'$ with parallel-connected freewheeling diodes (not shown for reasons of clarity). These semiconductor switches are connected to the control unit 4 via control lines.

A DC voltage sensor 10 is arranged on the input side, i.e. on the side of the DC voltage $V_1$. On the output side, i.e. on the side of the AC voltage $V_{ac}$, highly dynamic current sensors 6, 6' are arranged in the two output lines of the half bridges 3, 3'. The DC voltage sensor 10 and the current sensors 6, 6' are connected to the measuring unit 1 via data lines. The control unit 4 provides the measuring unit 1 with a trigger signal to enable synchronisation of the current measurement with the PWM actuation signals.

Figure 1C:
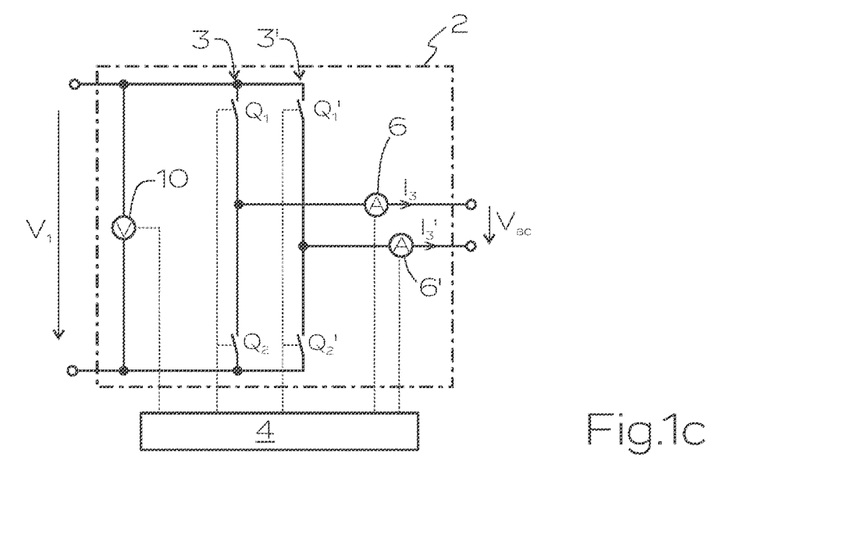
FIG. 1c shows another example of an embodiment of a measuring arrangement according to the invention as a schematic circuit diagram.

FIG. 1c shows a further example of an embodiment of a measuring arrangement according to the invention as a schematic circuit diagram. This embodiment corresponds substantially to that of FIG. 1b, whereby, however, the control unit 4 comprises the measuring unit 1; in other words, in this exemplary embodiment the function of the measuring unit 1 is performed by the control unit 4.

Figure 2A:
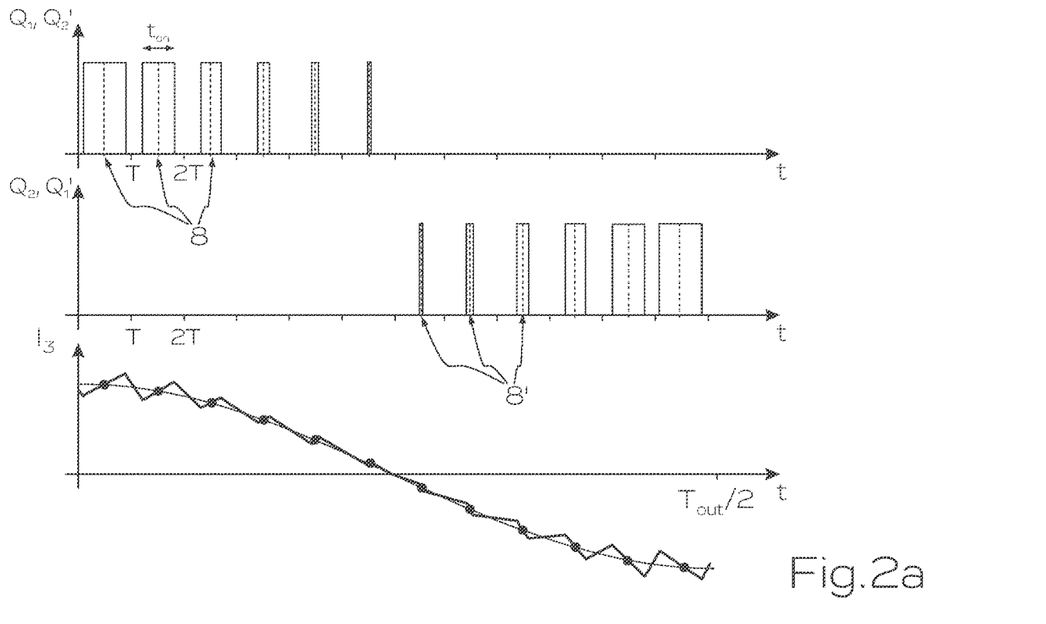
FIG. 2a shows schematically the profile of the actuation signals and the resulting current in the output line of the half bridges in an embodiment of a measuring arrangement according to the invention.

FIG. 2a shows schematically the profile of the actuation signals of the switches Q1, Q2' or Q2, Q1' and of the resulting current I3 in the output line of the left-hand half bridges 3 of the circuit from FIG. 1b. The PWM actuation signals of the switches are represented with solid lines. The control unit 4 controls the semiconductor switches with PWM modulated signals in such a way that an approximately sinusoidal current curve results in the output line. The dashed lines show the measurement times 8, 8' of the current sensors 6, 6'. In this exemplary embodiment, the measuring unit 1 queries the current sensors with a frequency that corresponds approximately to the frequency of the actuation signals, so that a current measurement takes place in each of the PWM actuation signals. The current value measured per period T is represented by a dot. The period duration of the PWM actuation signals is marked with the symbol T.

In this case, the measuring unit 1 knows the expected profile of the actuation signals and defines in advance measurement times 8,8' which substantially lie in the middle of the duty cycle $t_{on}$ of the actuation signals. Consequently, in this embodiment, the current sensors 6, 6' must be designed for a frequency corresponding to the frequency of the PWM actuation signal.

The transmitted electrical power of the output signal is calculated as the sum of the number M of half bridges and the number N of PWM pulses per period of the output signal $T_{out}$ from the average measured bridge current $I_{i,j}$ per half bridge and the DC voltage $V_{1,j}$ measured in the current pulse on the DC voltage side of the converter unit, wherein the DC voltage $V_{1,j}$ measured in the current pulse can optionally also be assumed to be constant:

$$P_{out} = \frac{1}{T_{out}} \int_0^{T_{out}} u(t) \cdot i(t) dt \approx \sum_{i=1}^{M} \sum_{j=1}^{N} V_{1,j} \cdot I_{i,j} \approx V_1 \cdot \sum_{i=1}^{M} \sum_{j=1}^{N} I_{i,j}$$

The calculated transmitted electrical power can then be compared with the mechanical power calculated from the mechanical parameters of the electrical machine 7. An efficiency of the electrical machine 7 can be calculated from the ratio of mechanical power to electrical power. The mechanical power of the electrical machine 7 can also be determined from the measured waste heat.

Figure 2B:
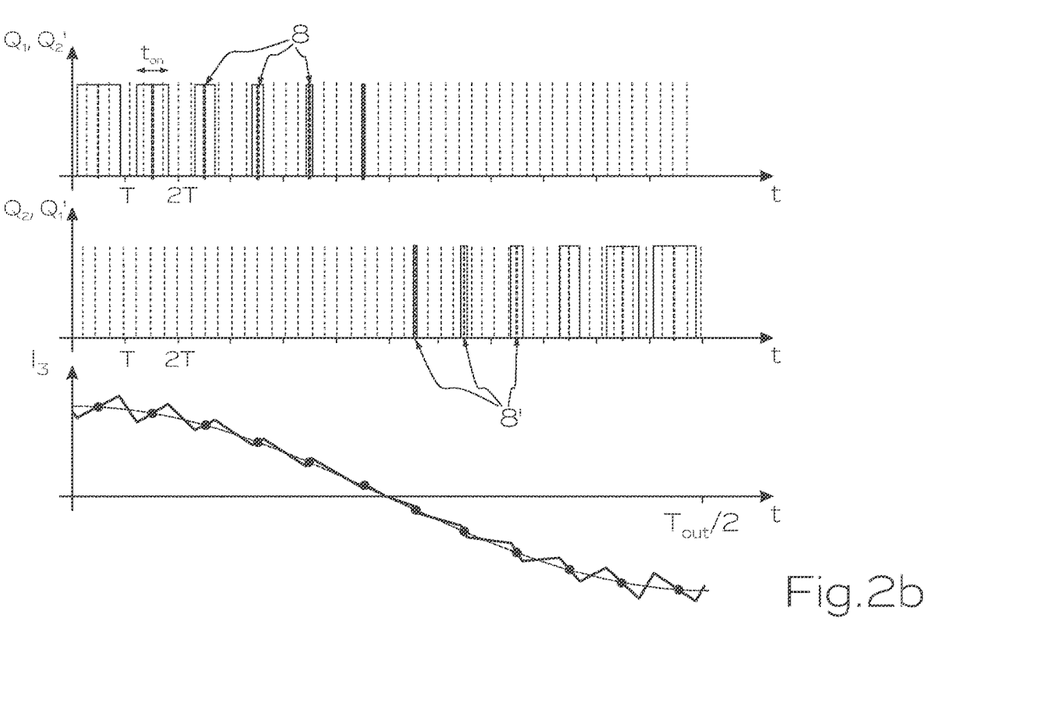
FIG. 2b shows schematically the profile of the actuation signals and the resulting current in the output line of the half bridges in a further embodiment of a measuring arrangement according to the invention.

FIG. 2b shows schematically the profile of the actuation signals and the resulting current in the output line of the half bridges in a further embodiment of a measuring arrangement according to the invention. In this exemplary embodiment, the measuring unit 1 queries the current sensors 6, 6' with a measuring frequency that is significantly higher than the frequency of the actuation signals, as can be seen from the numerous dashed lines. Only afterwards, i.e. in a post-processing step, does the measuring unit 1 select those measurement times 8,8' which lie substantially in the middle of the duty cycle $t_{on}$ of the actuation signals. Here too, the transmitted electrical power of the output signal is calculated according to the above formula. This allows the flexible adaptation of the power measurement to the PWM process; however, this requires the use of highly dynamic current sensors.

Figure 3:
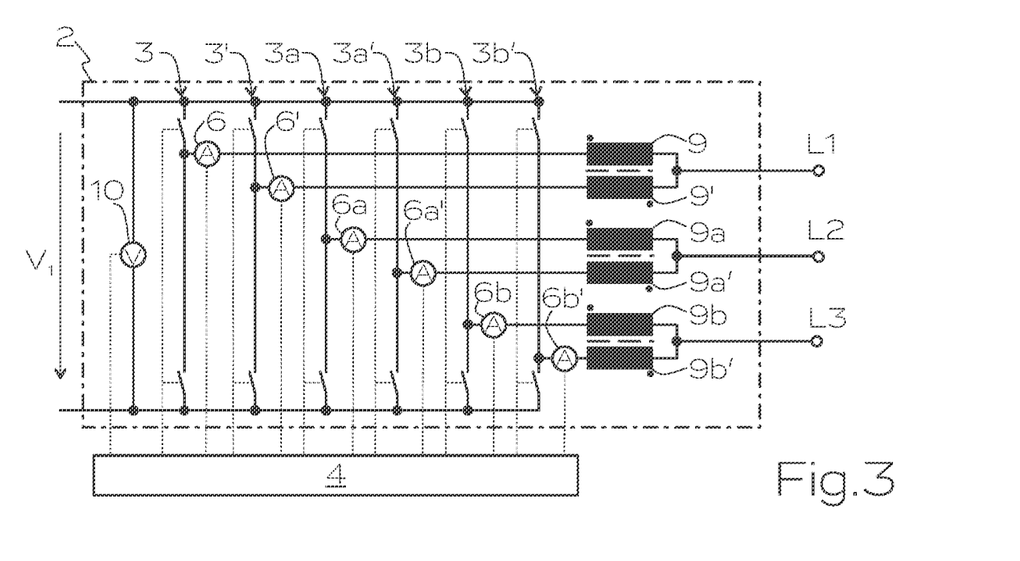
FIG. 3 shows an exemplary embodiment of a further embodiment of a measuring arrangement according to the invention as a schematic circuit diagram.

FIG. 3 shows an exemplary embodiment of a further embodiment of a measuring arrangement according to the invention as a schematic circuit diagram. In this exemplary embodiment, the converter unit 2 is designed as a 3-phase inverter which converts a DC voltage $V_1$ into a 3-phase AC voltage with the phases L1, L2, L3 by means of six half bridges 3, 3', 3a, 3a', 3b', arranged in parallel and controlled electronically by the control unit 4. In each case two half bridges are interconnected via current-compensated interleaving chokes 9, 9', 9a, 9a', 9b', 9b' to enable a smooth current transfer between the half bridges. A current sensor 6, 6', 6a, 6a', 6b', 6b' is arranged in each output line of the half bridges; the input DC voltage is measured via a DC voltage sensor 10. In this exemplary embodiment, the measuring unit 1 is again integrated into the control unit 4. The measuring unit 1 is designed to calculate the electrical power of each phase L1, L2, L3 from the synchronised measured values from the current sensors 6, 6', 6a', 6b', 6b' and the DC voltage sensor 10.

Figure 4:
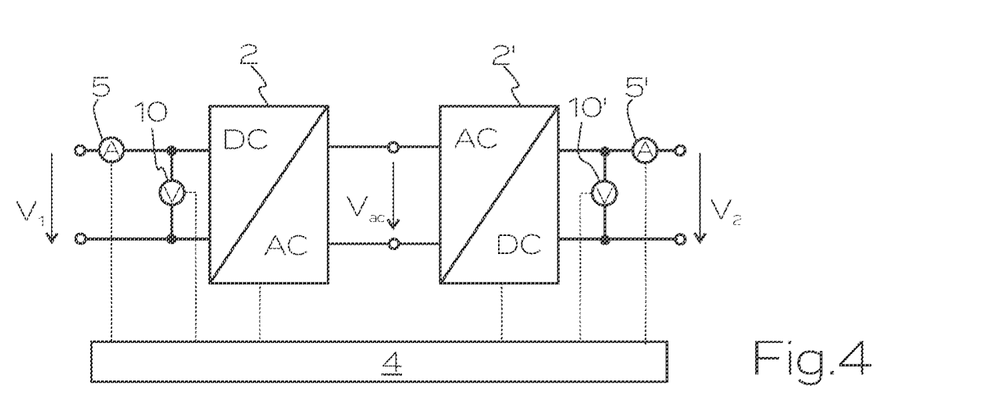
FIG. 4 shows an example of an embodiment of an inverter arrangement according to the invention as a schematic block diagram.

FIG. 4 shows an example of an embodiment of an inverter arrangement according to the invention as a schematic block diagram. The inverter arrangement comprises a measuring arrangement and two converter units 2, 2' which function as an inverter and downstream rectifier. In this exemplary embodiment, the measuring unit 1 is again integrated into the control unit 4. In each of the converter units 2, 2', two electronic half bridges 3, 3' are, in a modulation process, switched with temporally offset actuation signals by a control unit 4. Together, the two converter units 2, 2' thus form a DC converter that converts the DC voltage $V_1$ into the DC voltage $V_2$.

In each of the two converter units 2, 2', the input and output currents of the half bridges are measured synchronously with the actuation signals via current sensors 6, 6'; furthermore, the DC voltages V1 and V2 are also measured. This allows the electrical power of the two converter units 2, 2' to be measured separately from each other, and the efficiency of each converter unit 2, 2' can be determined. Furthermore, in this exemplary embodiment DC sensors 5.5' are provided on the input side and output side. These can be used to calibrate the dynamic current sensors 6, 6' arranged in the converter units 2, 2', a predefined load being connected on the output side for this purpose.

The invention is not limited to the present exemplary embodiments, but covers all devices and methods within the scope of the following claims. In particular, the invention is not limited to the use of pulse width modulation methods with constant switching frequency, but also includes the use of pulse width modulation methods with variable switching frequency.

Terms used herein should not be interpreted too narrowly. Also, the concrete realisation of the inverter or rectifier arrangement in terms of circuit technology is not essential to the invention.

Converter units according to the invention in the form of inverter or rectifier arrangements or DC converters can always also provide an internal galvanic isolation and can be intended for medium to high electrical powers, for example powers in the range of 10 kW to 100 kW at a DC voltage of 12V, 24V, 48V, 230V or 850 V or to 300 kVA AC power.

Figure 5:
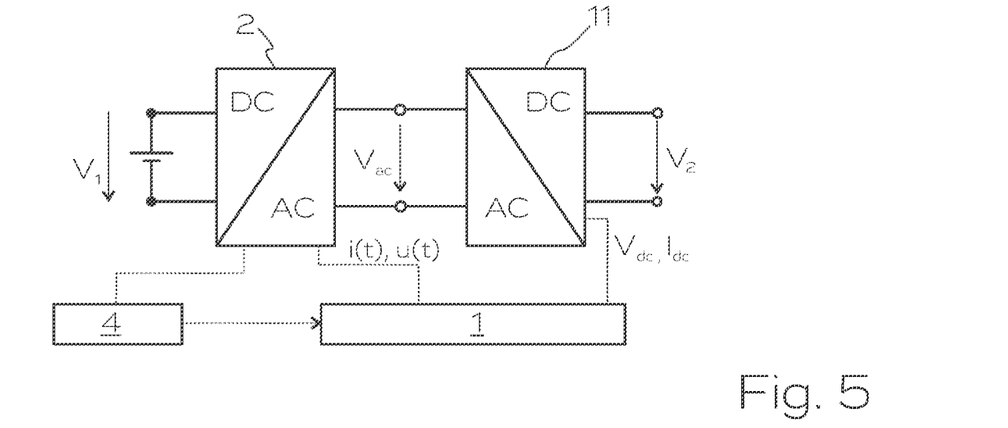
FIG. 5 shows an example of an embodiment of a measuring arrangement according to the invention as a schematic block diagram with an inverter arrangement.

FIG. 5 shows an example of an embodiment of a measuring arrangement according to the invention as a schematic block diagram. As already described in FIG. 1a with an exemplary electrical machine 7, in addition to the described electrical machine 7, an inverter arrangement or a switched DC converter can of course also be connected to the electrical converter unit 2. The measuring arrangement comprises an electronic measuring unit 1 which is connected via interfaces to current sensors 6, 6' (not shown) in an electrical converter unit 2. The measuring unit 1 is also connected via interfaces to sensors for measuring electrical parameters of an inverter arrangement 11 under test, namely direct current $I_{dc}$ and DC voltage $V_{dc}$.

In this exemplary embodiment, the converter unit 2 is a switched inverter arrangement 11 which converts a DC voltage $V_1$ supplied by a battery into an AC voltage $V_{ac}$ for operation of the inverter arrangement 11 under test. The converter unit 2 comprises two electronic half bridges 3, 3' which, in a modulation process, are switched with temporally offset actuation signals by an electronic control unit 4. In this exemplary embodiment, the control unit 4 and the measuring unit 1 are designed as separate units. The control unit 4 calculates trigger times for controlling the electronic half bridges 3, 3' of the converter unit 2 and makes these available to the converter unit 2. The current sensors 6, 6' are arranged in the output or input lines of the half bridges 3, 3' of the converter unit 2 in order to measure the bridge currents.

The measuring unit 1 is connected to the control unit 4 for temporal synchronisation and is designed to define measurement times 8, 8' of the current sensors 6, 6' which are synchronised in time with the actuation signals of the half bridges 3, 3'. This allows the measuring unit 1 to detect the current values exactly when the PWM actuation signals activate the respective half bridge.

The inverter arrangement 11 under test is in particular a converter assigned to an electrical machine.

Figure 6:
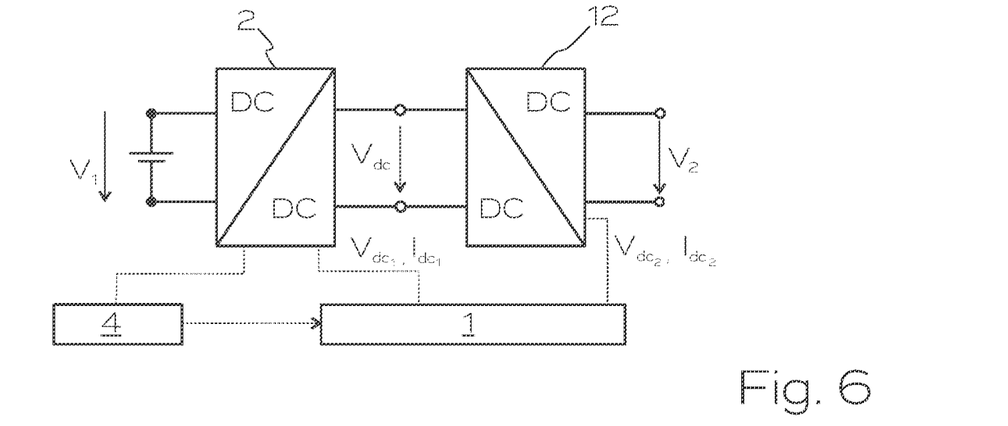
FIG. 6 shows an example of an embodiment of a measuring arrangement according to the invention as a schematic block diagram with a switched DC converter.

FIG. 6 shows an example of an embodiment of a measuring arrangement according to the invention as a schematic block diagram. The measuring arrangement comprises an electronic measuring unit 1 which is connected via interfaces to current sensors 6, 6' (not shown) in an electrical converter unit 2. The measuring unit 1 is also connected via interfaces to sensors for measuring electrical parameters of a switched DC converter 12 under test, namely direct current $I_{dc2}$ and DC voltage $U_{dc2}$.

In this exemplary embodiment, the converter unit 2 is likewise a switched DC converter which converts a DC voltage $V_1$ supplied by a battery into a DC voltage $V_{dc}$ for operation of the switched DC converter 12 under test. The converter unit 2 comprises two electronic half bridges 3, 3' which, in a modulation process, are switched with temporally offset actuation signals by an electronic control unit 4. In this exemplary embodiment, the control unit 4 and the measuring unit 1 are designed as separate units. The control unit 4 calculates trigger times for controlling the electronic half bridges 3, 3' of the converter unit 2 and makes these available to the converter unit 2. The current sensors 6, 6' are arranged in the output or input lines of the half bridges 3, 3' of the converter unit 2 in order to measure the bridge currents.

The measuring unit 1 is connected to the control unit 4 for temporal synchronisation and is designed to define measurement times 8, 8' of the current sensors 6, 6' which are synchronised in time with the actuation signals of the half bridges 3, 3'. This allows the measuring unit 1 to detect the current values exactly when the PWM actuation signals activate the respective half bridge.

The switched DC converter 12 under test is in particular a DC converter installed downstream of a fuel cell in the vehicle or a DC converter of a DC voltage charging infrastructure.

LIST OF REFERENCE SYMBOLS

1 measuring unit
2, 2' converter unit
3, 3', 3a, 3a', 3b, 3b' half bridge
4 control unit
5, 5' DC sensor
6, 6', 6a, 6a', 6b, 6b' current sensor
7 electrical machine
8, 8' measurement time
9, 9', 9a, 9a', 9b, 9b' interleaving choke
10, 10' DC voltage sensor
11 inverter arrangement
12 DC converter

What is claimed is:

1. A measuring arrangement for determining an electrical power of a switched electrical converter unit, in which, in a modulation process, at least two electronic half bridges are switched with temporally offset actuation signals by a control unit, comprising a measuring unit that is connected to current sensors,
    wherein the current sensors are arranged in output or input lines of the half bridges of the converter unit in order to measure bridge currents;
    wherein the measuring unit is connected to the control unit for temporal synchronisation;

wherein the measuring unit is designed to define measurement times of the current sensors which are temporally synchronised with the actuation signals of the half bridges;

wherein the measuring unit is designed to query the current sensors with a measuring frequency which corresponds approximately to a frequency of the actuation signals and to define in advance measurement times which lie substantially in a middle of a duty cycle $t_{on}$ of the actuation signals.

2. The measuring arrangement according to claim 1, wherein the measuring unit is designed to query the current sensors with a measuring frequency which is higher than the frequency of the actuation signals, and to select retrospectively those measurement times which lie substantially in the middle of the duty cycle $t_{on}$ of the actuation signals.

3. The measuring arrangement according to claim 1, wherein the measuring unit is designed to query the current sensors during the duty cycle $t_{on}$ of the actuation signals at a plurality of measurement times, and to average resulting measured values.

4. The measuring arrangement according to claim 1, wherein the measuring unit
   a. is connected to at least one DC voltage sensor arranged on a DC voltage side of the converter unit, and
   b. is designed to calculate the switched electrical power of the converter unit or individual phases of the converter unit from the measured bridge currents and the measured DC voltage.

5. The measuring arrangement according to claim 4, wherein the measuring unit is designed to take into account electrical internal resistances of semiconductor switches and other electronic components of the half bridges when calculating the electrical power of the converter unit.

6. The measuring arrangement according to claim 1, wherein the measuring unit
   a. is connected to at least one DC sensor arranged on a DC voltage side of the converter unit, and
   b. is designed to calculate the electrical power on the DC voltage side of the converter unit, and
   c. is designed to calculate an electrical efficiency of the converter unit.

7. An inverter arrangement, comprising the measuring arrangement according to claim 1 and the converter unit, in which, in a modulation process, at least the two electronic half bridges are switched with the temporally offset actuation signals by a control unit, wherein the converter unit is a switched inverter arrangement for converting a DC voltage ($V_{dc}$) into an AC voltage ($V_{ac}$).

8. The inverter arrangement according to claim 7, wherein the converter unit is connected to an electrical machine.

9. The inverter arrangement according to claim 8, wherein the measuring unit is designed to receive mechanical measured values of the electrical machine.

10. The inverter arrangement according to claim 9, wherein the mechanical measured values are speed and torque are used to calculate the mechanical output of the electrical machine.

11. The inverter arrangement according to claim 8, wherein the measuring unit is designed to receive thermal measured values of the electrical machine.

12. The inverter arrangement according to claim 11, wherein the thermal measured values are temperature of a motor winding, waste heat or differential temperature of a cooling medium of the electrical machine.

13. The inverter arrangement according to claim 8, wherein the measuring unit is designed to determine from the electrical or mechanical measured parameters of the electrical machine.

14. The inverter arrangement according to claim 8, wherein the measuring unit is designed to determine from the switched electrical power of the converter unit and a mechanical power of the electrical machine the efficiency of the electrical machine.

15. Inverter arrangement according to claim 7, wherein the control unit and the measuring unit are integrated in a common unit.

16. The inverter arrangement according to claim 8, wherein the electrical machine is an electric motor or an electric generator, and the measuring unit is connected to the electrical machine.

17. An inverter arrangement, comprising the measuring arrangement according to claim 1 and the converter unit, in which, in a modulation process, at least the two electronic half bridges are switched with the temporally offset actuation signals by a control unit, wherein the converter unit is a switched rectifier arrangement for converting an AC voltage ($V_{ac}$) into a DC voltage ($V_{dc}$).

18. An inverter arrangement, comprising the measuring arrangement according to claim 1 and the converter unit, in which, in a modulation process, at least the two electronic half bridges are switched with the temporally offset actuation signals by a control unit, wherein the converter unit is a switched DC converter for converting a first DC voltage ($V_1$) into a second DC voltage ($V_2$).

* * * * *